(12) United States Patent
Kim et al.

(10) Patent No.: US 8,024,598 B2
(45) Date of Patent: Sep. 20, 2011

(54) APPARATUS AND METHOD FOR CLOCK GENERATION WITH PIECEWISE LINEAR MODULATION

(75) Inventors: Chulwoo Kim, Seoul (KR); Song Minyoung, Seoul (KR); Ahn Sunghoon, Gyeonggi-do (KR)

(73) Assignee: Korea University Industrial & Academic Collaboration Foundation, Seoul (KR)

( * ) Notice: Subject to any disclaimer, the term of this patent is extended or adjusted under 35 U.S.C. 154(b) by 798 days.

(21) Appl. No.: 12/022,761

(22) Filed: Jan. 30, 2008

(65) Prior Publication Data
US 2009/0083567 A1    Mar. 26, 2009

(30) Foreign Application Priority Data
Jan. 31, 2007    (KR) ........................ 10-2007-0010281

(51) Int. Cl.
*G06F 1/04*    (2006.01)
*G06F 1/14*    (2006.01)

(52) U.S. Cl. ........ 713/501; 713/500; 713/502; 713/600; 375/130; 375/375

(58) Field of Classification Search ................ 713/500, 713/501, 600, 502; 375/130, 376
See application file for complete search history.

(56) References Cited

U.S. PATENT DOCUMENTS
7,233,210 B2 *   6/2007   Kaizuka ........................ 331/1 A
7,327,172 B2 *   2/2008   Leung et al. ................... 327/147
2006/0176933 A1 * 8/2006  Uemura et al. ................ 375/130
2006/0290391 A1 * 12/2006 Leung et al. ................... 327/147

* cited by examiner

*Primary Examiner* — Thomas Lee
*Assistant Examiner* — Michael J Brown
(74) *Attorney, Agent, or Firm* — Rabin & Berdo, P.C.

(57) ABSTRACT

An apparatus and method for generating a clock using piecewise linear modulation are provided. The apparatus includes: a modulation profile generator for outputting an M-bit digital profile obtained by quantizing a piecewise linear modulation profile consisting of two or more linear signals; a delta-sigma modulator for receiving the M-bit digital profile and outputting a K-bit profile obtained by delta-sigma modulating the M-bit digital profile, K being a smaller number than M; a phase-frequency comparator for outputting up and down pulses having the same phase difference as that between a reference clock and a feedback clock; a charge pump for outputting a predetermined current for a time corresponding to the phase difference between the up and down pulses; a loop filter for outputting a control voltage corresponding to the predetermined current; a voltage controlled oscillator (VCO) for outputting a multi-phase clock having a frequency corresponding to a level of the control voltage; and a fractional divider for receiving the multi-phase clock of the VCO, selecting a divider according to the K-bit profile, and outputting a divided clock as the feedback clock. Therefore, it is possible to minimize electromagnetic interference (EMI) using piecewise linear modulation, and to readily implement the apparatus and method on a chip due to the modulation profile consisting of two or more linear signals. In addition, the delicate fractional divider using a multi-phase clock of the VCO and a phase interpolator allows precise frequency interpolation. Furthermore, unnecessary power consumption can be reduced by preventing application of a clock to an unused block.

6 Claims, 9 Drawing Sheets

T : CLOCK PERIOD, N : NUMBER OF MULTIPLE PHASES

APPARATUS AND METHOD FOR CLOCK GENERATION WITH PIECEWISE LINEAR MODULATION

CROSS-REFERENCE TO RELATED APPLICATION

This application claims the benefit of Korean Patent Application No. 2007-0010281, filed Jan. 31, 2007, the disclosure of which is hereby incorporated herein by reference in its entirety.

BACKGROUND OF THE INVENTION

1. Field of the Invention

The present invention relates to a clock generator, and more particularly, to an apparatus and method for generating a clock using piecewise linear modulation.

2. Description of the Related Art

Due to increasing use and demand for various portable devices, electromagnetic interference (EMI) between components of a portable device is becoming an increasingly large problem. A simple EMI problem may be transient distortion of video or audio data, but a serious EMI problem may cause components to malfunction. With miniaturization and integration of portable devices, methods of coping with EMI are under active discussion. Products are predicted to be further integrated and miniaturized and to operate at higher speeds in the future, and thus demand for technology for preventing EMI will further increase.

To prevent on-chip EMI, components of a portable device may be covered. However, since the size and cost of the device drastically increases, this method is not feasible.

A method of increasing rising time to reduce high-frequency components of a signal can be simply implemented using Resistive Capacitive (RC) delay when a portable device has a clock frequency of about 30 MHz or less. However, when a delay is shortened due to increase in the clock frequency, it is difficult to adjust skew and control rising time. Thus, it is impossible to efficiently reduce radiated electromagnetic waves by increasing rising time in a system having a high clock frequency.

Currently, spread spectrum technology is mentioned as the most effective method for reducing EMI.

Spread spectrum clocks are compatible with a conventional clock driving method and can use an extended frequency of several hundred MHz to several GHz. In addition, since a clock signal is modulated, a signal applied to all circuits synchronized with the clock to operate is also modulated. When the clock is modulated, not only all data but also noise generated on a power line are modulated. In this way, spread spectrum clocks reduce EMI generated in digital systems.

The spread spectrum technology modulates a period or frequency of a regular clock to evenly distribute energy concentrated on a specific frequency band over a wider frequency band.

Most conventional spread spectrum clock generators introduce an intended jitter into a regular clock using a Phase-Locked Loop (PLL) or Delay Locked Loop (DLL) to generate a spread spectrum clock. However, such a jitter deteriorates the performance of an analog front end of a microprocessor, and a relatively complex circuit is necessary to demodulate the spread spectrum clock into the regular clock.

Therefore, a method of inverting the phase of a regular clock according to a specific modulation profile to generate a spread spectrum clock has been developed.

As illustrated in FIG. 1A, a conventional spread spectrum clock generator 100 using phase inversion roughly includes a multiplexer 106, an inverter 108, a pattern generator 114 and a divider 126.

When a regular clock 102 is input through an input terminal 104 of the spread spectrum clock generator 100 using phase inversion, it is uniformly applied to the multiplexer 106 and the inverter 108. The inverter 108 applies a clock 110 having an inverse phase with respect to the regular clock 102 to an input terminal 112 of the multiplexer 106. The pattern generator 114 also receives the regular clock 102 and outputs a modulation signal 116, and a modulation profile is determined according to a constitution of the pattern generator 114. The multiplexer 106 selects one of the regular clock 102 and the clock 110 having the inverse phase according to the modulation signal 116, and outputs a spread spectrum clock 124 having a modulated phase. In addition, the phase-modulated spread spectrum clock 214 may be demodulated by the divider 126 into a regular clock 128 and used in an analog front end of a microprocessor.

There are two modulation schemes frequently used in Spread-Spectrum Clock Generators (SSCGs). A triangular modulation scheme of FIG. 1B outputs a linear signal and thus is readily implemented on a chip.

A Hershey-Kiss modulation scheme of FIG. 1C reduces peaks shown at both ends of an output clock based on the triangular modulation scheme to maximize reduction in EMI.

However, when a conventional clock generator uses the triangular modulation scheme, peaks are shown at both ends of an output clock, and thus reduction in EMI decreases. Since the Hershey-Kiss modulation scheme outputs a non-linear signal, it is difficult to implement on a chip and thus is mostly implemented using a memory.

SUMMARY OF THE INVENTION

The present invention is directed to a clock generator using piecewise linear modulation that can minimize Electromagnetic Interference (EMI), can be readily implemented on a chip due to a modulation profile consisting of two or more linear signals, and can precisely synthesize frequencies.

The present invention is also directed to a clock generation method using piecewise linear modulation applied to the clock generator using piecewise linear modulation.

A first aspect of the present invention provides an apparatus for generating a clock using piecewise linear modulation, including: a modulation profile generator for outputting an M-bit digital profile obtained by quantizing a piecewise linear modulation profile consisting of two or more linear signals; a delta-sigma modulator for receiving the M-bit digital profile and outputting a K-bit profile obtained by delta-sigma modulating the M-bit digital profile, K being a smaller number than M; a phase-frequency comparator for outputting up and down pulses having the same phase difference as that between a reference clock and a feedback clock; a charge pump for outputting a predetermined current for a time corresponding to the phase difference between the up and down pulses; a loop filter for outputting a control voltage corresponding to the predetermined current; a voltage controlled oscillator (VCO) for outputting a multi-phase clock having a frequency corresponding to a level of the control voltage; and a fractional divider for receiving the multi-phase clock of the VCO, selecting a divider according to the K-bit profile, and outputting a divided clock as the feedback clock.

A second aspect of the present invention provides an apparatus for generating a clock using piecewise linear modulation, including: a modulation profile generator for outputting a digital profile obtained by quantizing a piecewise linear modulation profile consisting of two or more linear signals; a phase-frequency comparator for outputting up and down pulses having the same phase difference as that between a reference clock and a feedback clock; a control voltage generator for generating a control voltage corresponding to the phase difference between the up and down pulses; a VCO for outputting a multi-phase clock having a frequency corresponding to a level of the control voltage; and a fractional divider for receiving the multi-phase clock of the VCO, selecting a divider according to the digital profile of the modulation profile generator, and applying a divided clock as the feedback clock.

A third aspect of the present invention provides an apparatus for generating a clock using piecewise linear modulation which has a divider, including: a modulation profile generator for applying to an input of the divider a digital profile obtained by quantizing a piecewise linear modulation profile consisting of two or more linear signals.

A fourth aspect of the present invention provides an apparatus for generating a clock using piecewise linear modulation, including: a modulation profile generator for outputting a digital profile obtained by quantizing a piecewise linear modulation profile according to an input clock signal; and a fractional divider for receiving a multi-phase clock of a VCO, selecting a divider according to the digital profile of the modulation profile generator, and generating a divided clock.

A fifth aspect of the present invention provides a method of generating a clock using piecewise linear modulation, including: outputting an M-bit digital profile obtained by quantizing a piecewise linear modulation profile consisting of two or more linear signals; receiving the M-bit digital profile and outputting a K-bit profile obtained by delta-sigma modulating the M-bit digital profile, K being a smaller number than M; outputting up and down pulses having the same phase difference as that between a reference clock and a feedback clock; outputting a predetermined current for a time corresponding to the phase difference between the up and down pulses; outputting a control voltage corresponding to the predetermined current; outputting a multi-phase clock having a frequency corresponding to a level of the control voltage; and receiving the multi-phase clock, selecting a divider according to the K-bit profile, and applying a divided clock as the feedback clock.

The present invention is aimed at providing a spread spectrum clock that can be readily implemented on-chip and can minimize EMI. To this end, a new modulation technique capable of minimizing EMI while outputting a linear signal is provided. In addition, a new Phase-Locked Loop (PLL) feedback divider is provided to effectively use the suggested modulation technique.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. The present invention is not limited to the exemplary embodiments disclosed below, but rather can be implemented in various forms. The following exemplary embodiments are described in order to fully enable those of ordinary skill in the art to embody and practice the present invention.

Figure 1A:
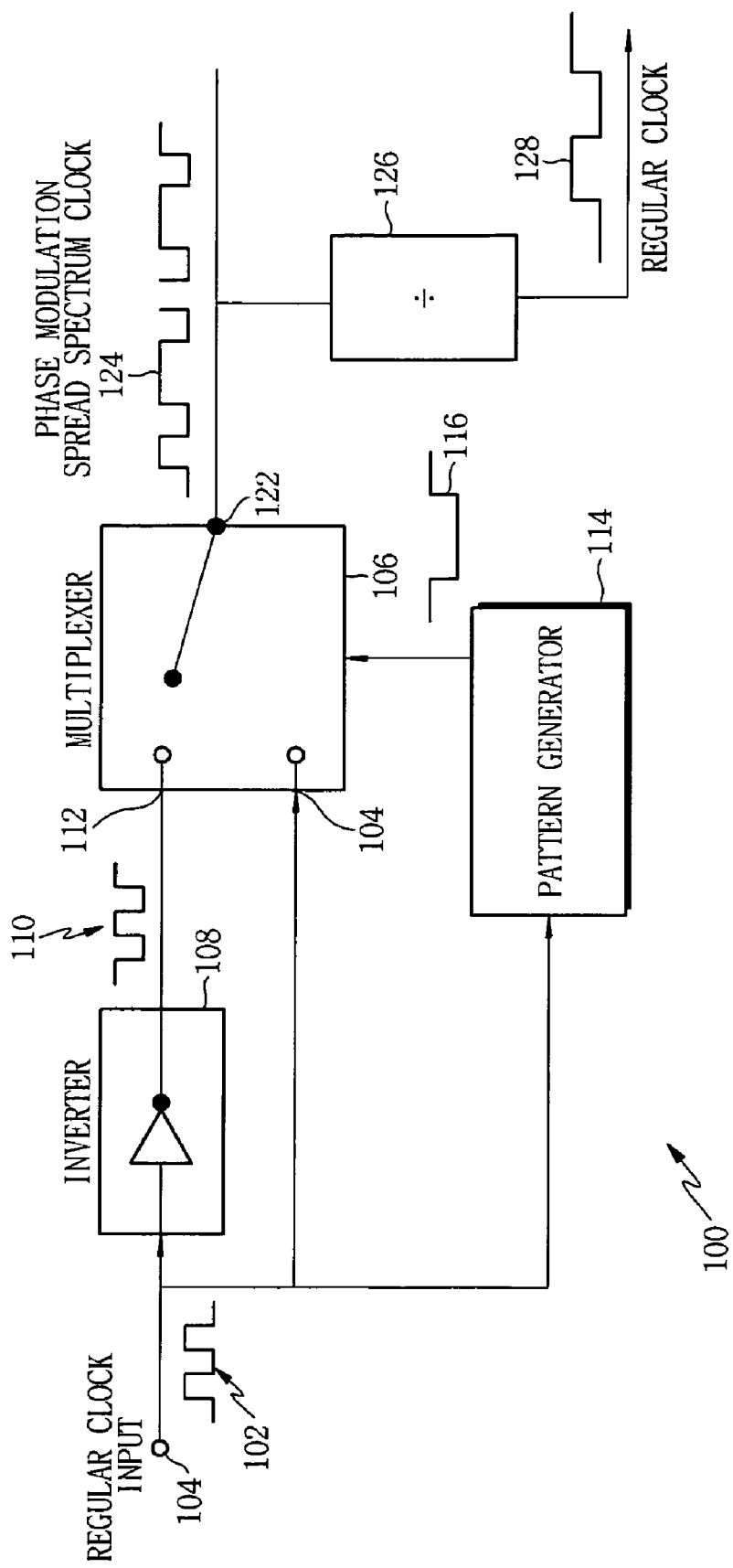
FIG. 1A is a block diagram of a conventional Spread-Spectrum Clock Generator (SSCG)
Figure 1B:
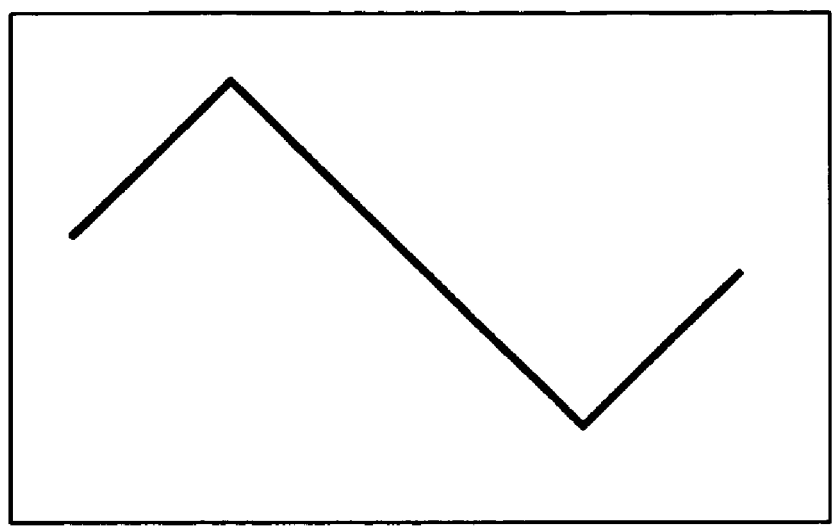
FIGS. 1B and 1C illustrate modulation profiles of a conventional SSCG.
Figure 1C:
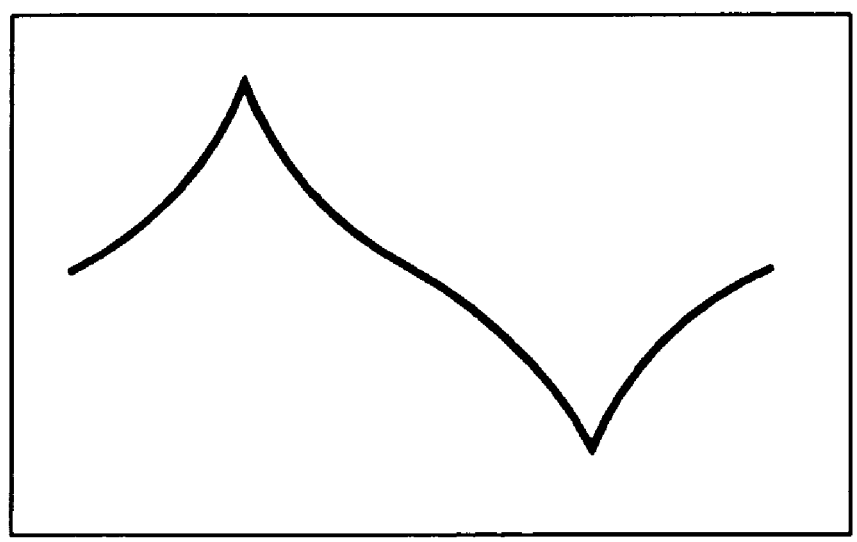
Figure 2:
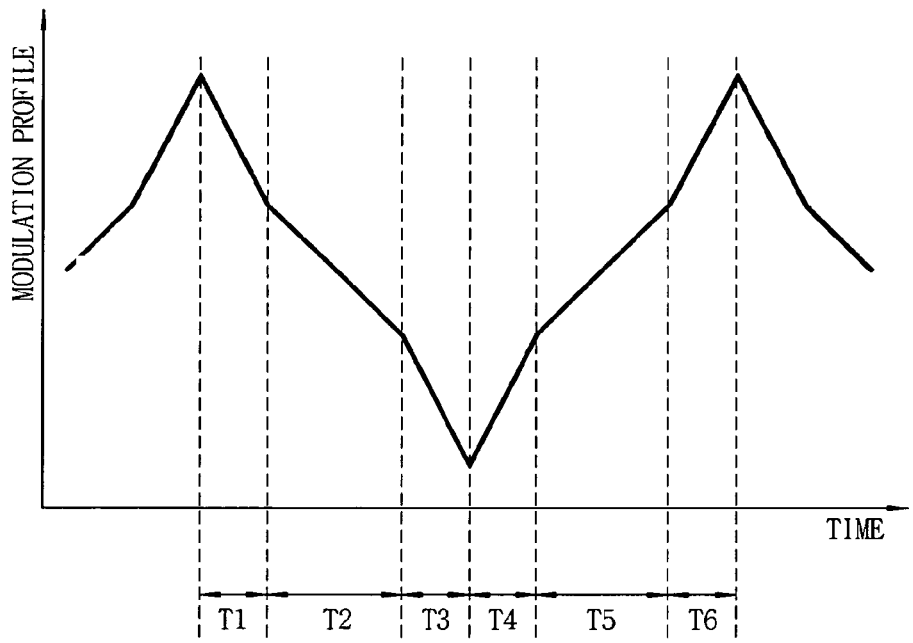
FIG. 2 illustrates a piecewise linear modulation profile applied to the present invention.

FIG. 2 illustrates a piecewise linear modulation profile applied to the present invention.

The present invention provides a piecewise linear modulation profile as shown in FIG. 2. The piecewise linear modulation profile consists of linear signals to be readily implemented on-chip, and has high inclinations in a maximum section and a minimum section to minimize electromagnetic interference (EMI). The piecewise linear modulation profile consists of two or more linear signals.

Figure 3:
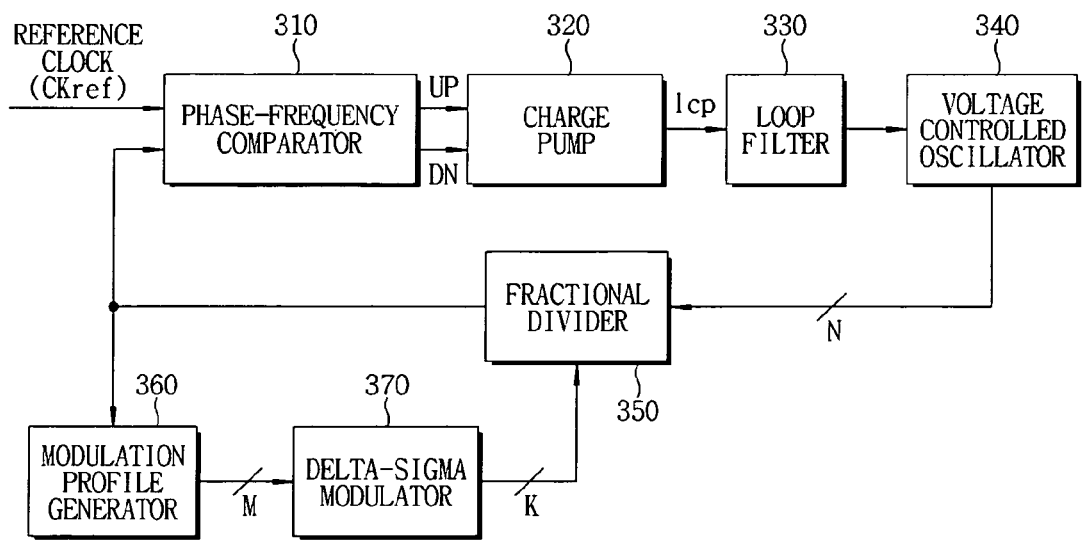
FIG. 3 is a block diagram of an apparatus for generating a clock using piecewise linear modulation according to an exemplary embodiment of the present invention.

FIG. 3 is a block diagram of an apparatus for generating a clock using piecewise linear modulation according to an exemplary embodiment of the present invention.

The clock generator of FIG. 3 includes a phase-frequency comparator 310, a charge pump 320, a loop filter 330, a voltage controlled oscillator (VCO) 340, a fractional divider 350, a modulation profile generator 360 and a delta-sigma modulator 370.

The phase-frequency comparator 310 compares a reference clock CKref with the phase of a feedback clock, and outputs up and down pulses UP and DN having the same phase difference as that between the two clocks.

The charge pump 320 receives the up and down pulses UP and DN, and outputs a predetermined current Icp for a time corresponding to the phase difference. Here, the predetermined current Icp has a magnitude and waveform that can be set by those skilled in the art in consideration of the magnitude and waveform of a control voltage.

The loop filter 330 receives the predetermined current Icp and outputs a control voltage Vctrl for the VCO 340. Here, the magnitude or period of the control voltage Vctrl corresponds to those of the predetermined current Icp.

The VCO 340 receives the control voltage Vctrl and outputs a multi-phase clock having a frequency corresponding to the level of the control voltage Vctrl.

The modulation profile generator 360 outputs an M-bit digital profile obtained by quantizing the piecewise linear modulation profile of FIG. 2. For example, the modulation profile generator 360 may be synchronized with the feedback clock or with a clock signal applied separately from the feedback clock.

The modulation profile generator 360 may comprise an accumulator and an accumulator controller. The accumulator controller outputs an accumulator control signal corresponding to the piecewise linear modulation profile. The accumulator adds or subtracts an appropriate value to/from a previous output according to the accumulator control signal.

To reduce the spur of an output clock, the modulation profile generator 360 may have a Pseudo Random Bit Sequence (PRBS) therein. To reduce unnecessary power consumption, clock gating technology preventing a clock from being applied to an unused block may be applied to the modulation profile generator 360.

The delta-sigma modulator 370 receives the M-bit profile and outputs a delta-sigma modulated K-bit profile SDo. The delta-sigma modulator 370 serves to reduce the M-bit input into K-bits (M>K) and simultaneously output quantized noise as a high-frequency component. To reduce quantization errors of the delta-sigma modulator 370, an output of two or more bits may be used.

The fractional divider 350 receives the multi-phase clock of the VCO 340 and outputs a divided clock. The division ratio of a conventional fractional divider is limited by the number of input multi-phase clocks. On the other hand, the fractional divider 350 according to an exemplary embodiment of the present invention employs a phase interpolator, and thus its division ratio is not limited by the number of input multi-phase clocks.

Figure 4:
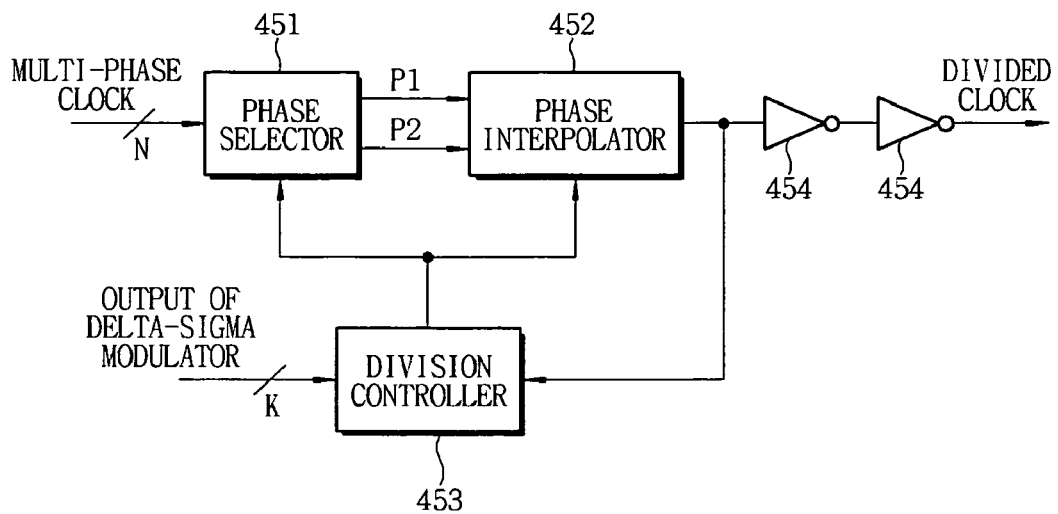
FIG. 4 is a block diagram of a fractional divider shown in FIG. 3.

FIG. 4 is a block diagram of the fractional divider 350 shown in FIG. 3.

The fractional divider 350 of FIG. 4 is a Phase-Locked Loop (PLL) feedback divider comprising a phase selector 451, a phase interpolator 452 and a division controller 453.

The phase selector 451 selects at least one clock signal from multi-phase clocks is according to a selection signal of the division controller 453.

The phase interpolator 452 interpolates clock signals selected by the phase selector 451 according to the selection signal of the division controller 453 and generates a divided clock. In the present invention, it is possible to perform precise division using a phase interpolator.

The division controller 453 outputs the selection signal according to the K-bit profile of the delta-sigma modulator 370 and the feedback clock.

Figure 9:
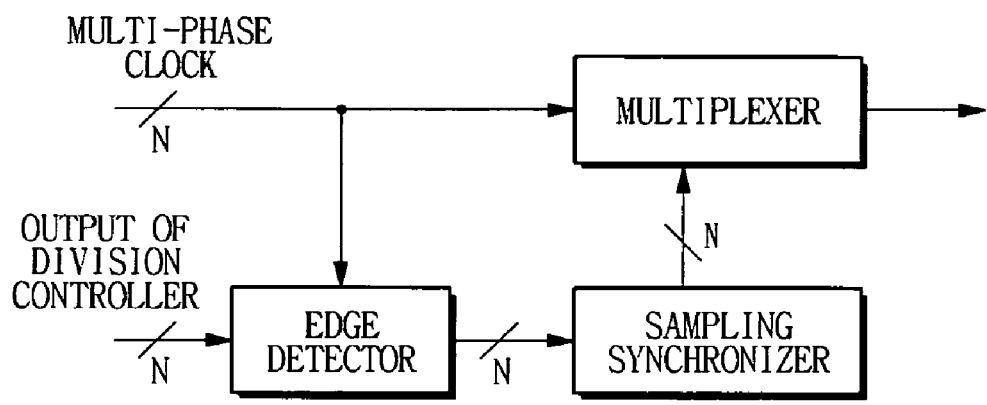
FIG. 9 is a block diagram of a phase selector shown in FIG. 4.

FIG. 9 is a block diagram of the phase selector 451 shown in FIG. 4. An edge detector 901 detects an edge of the output of the division controller 453, and a sampling synchronizer 903 synchronizes the multi-phase clocks with the detected edge. A multiplexer 905 selects at least one of the multi-phase clocks and divides the frequency.

Figure 10:
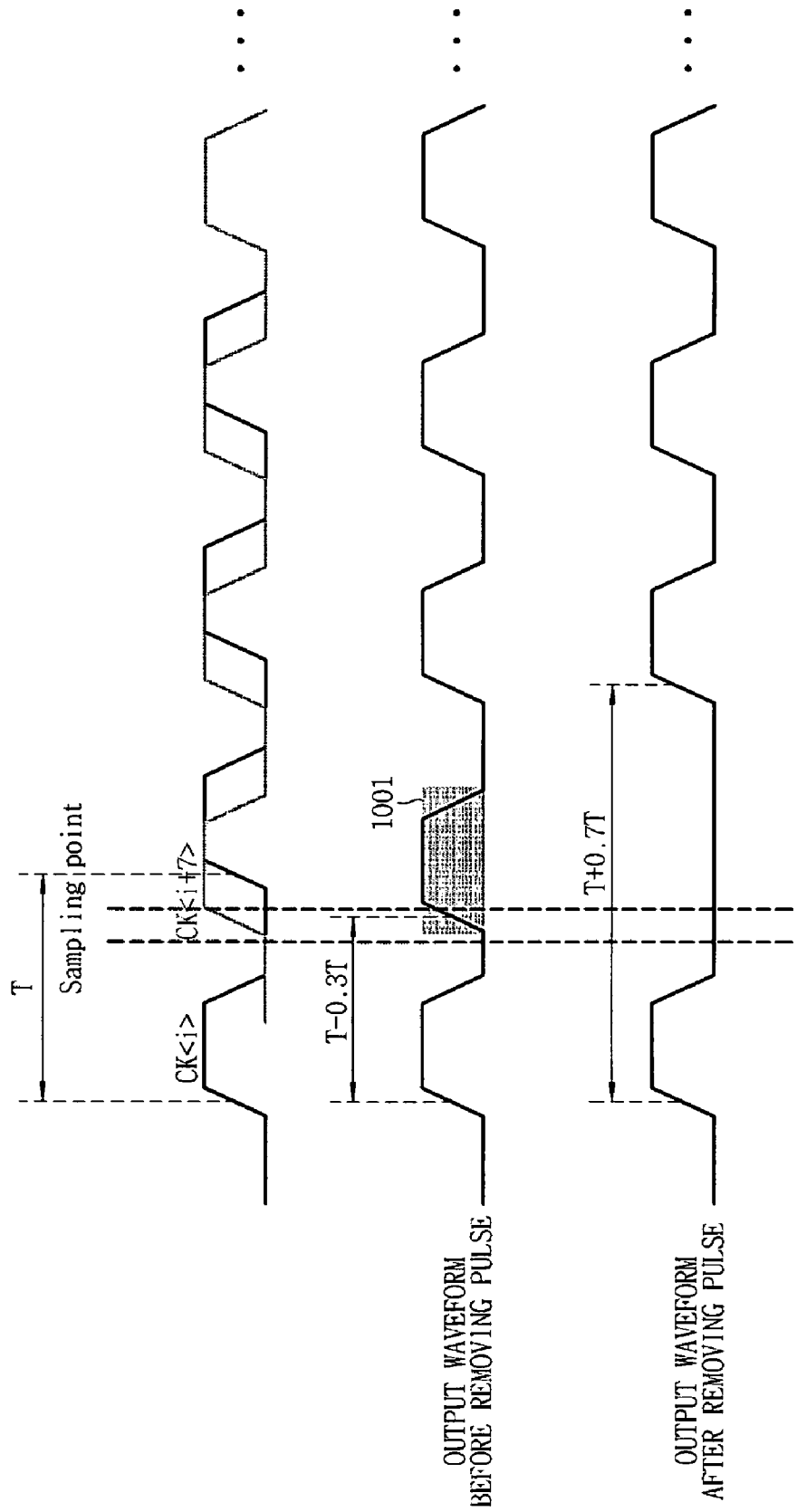
FIG. 10 illustrates output waveforms of a multiplexer shown in FIG. 9.

FIG. 10 illustrates output waveforms of the multiplexer 905 shown in FIG. 9. When a multi-phase clock having a phase difference of a half period or more is selected, an undesired pulse 1001 must be generated. The multiplexer 905 selects ground at a point in time when the undesired pulse 1001 detected by the edge detector 901 is generated, thereby removing the undesired pulse 1001.

Figure 5:
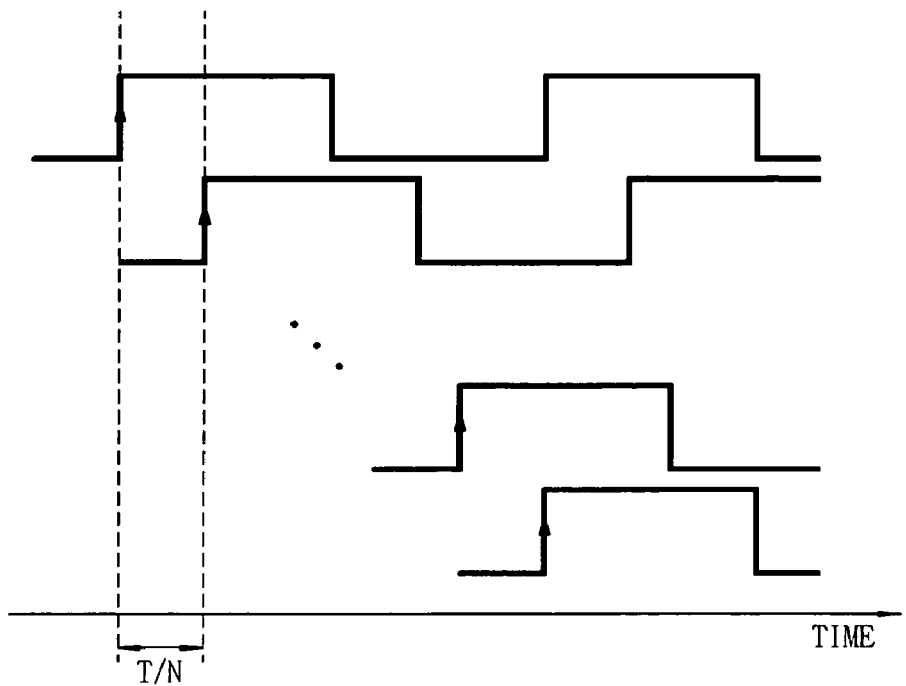
FIG. 5 illustrates multi-phase clocks of a voltage controlled oscillator (VCO) shown in FIG. 3.
Figure 6:
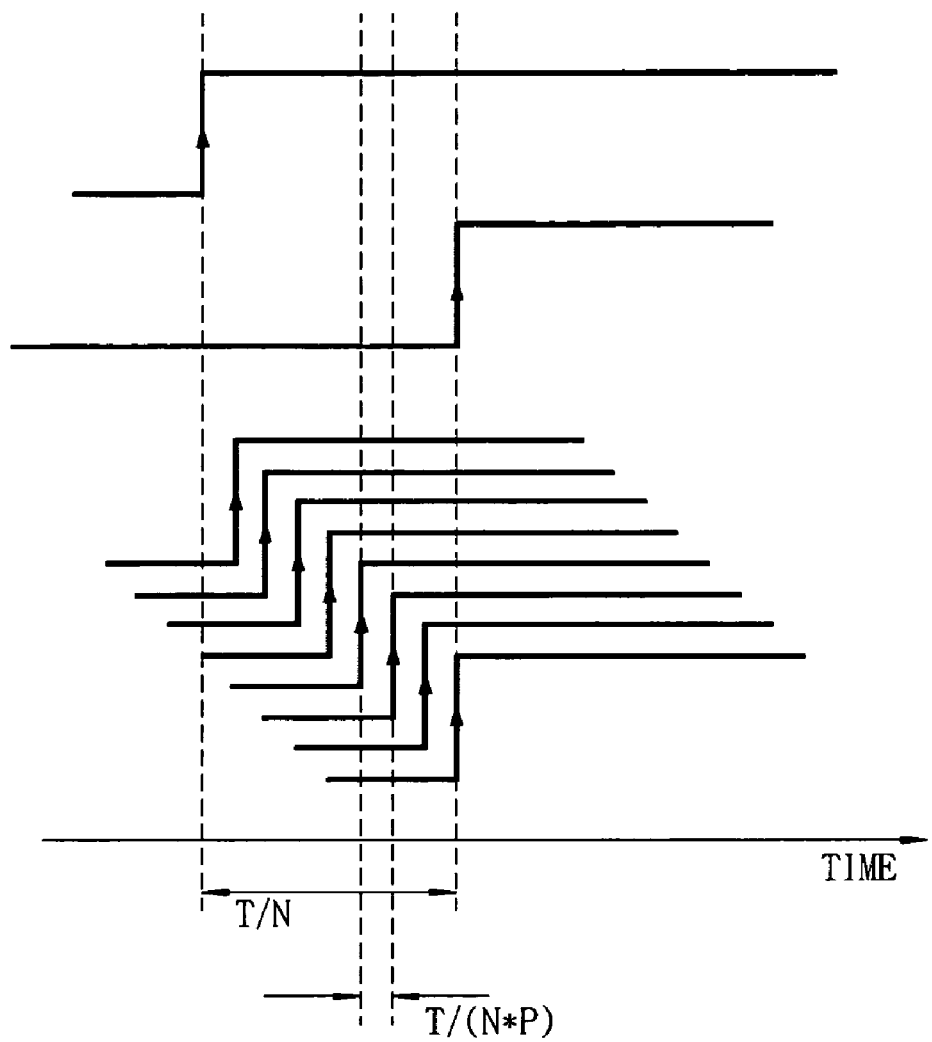
FIG. 6 illustrates output clocks of a phase interpolator shown in FIG. 4.

FIG. 5 illustrates multi-phase clocks of the VCO 340 shown in FIG. 3, and FIG. 6 illustrates output clocks of the phase interpolator 452 shown in FIG. 4.

When it is possible to receive N multi-phase clocks as illustrated in FIG. 5 and interpolate P phases as illustrated in FIG. 6, the degree of precision of the fractional divider 350 is 1/(N*P), as shown in Equation 1 below.

$$T_{div} = T_{in} \cdot INT \pm n \cdot \Delta T_{in}$$ Equation 1 where $\Delta T_{in} = T_{in}/(N*P)$

Figure 7:
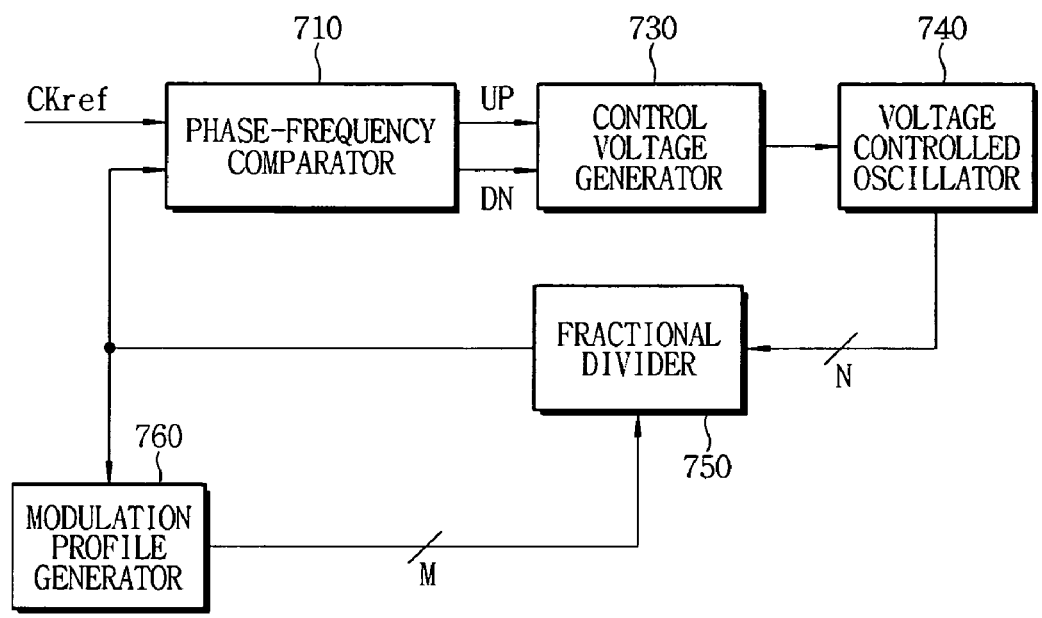
FIG. 7 is a block diagram of an apparatus for generating a clock using piecewise linear modulation according to another exemplary embodiment of the present invention.

FIG. 7 is a block diagram of an apparatus for generating a clock using piecewise linear modulation according to another exemplary embodiment of the present invention.

A phase-frequency comparator 710 outputs up and down pulses having the same phase difference as that between a reference clock CKref and a feedback clock.

A control voltage generator 730 generates a control voltage corresponding to the phase difference between the up and down pulses. For example, the control voltage generator 730 may receive the up and down pulses, generate a predetermined current Icp for a time corresponding to the phase difference, and output a control voltage Vctrl corresponding to the predetermined current Icp.

A VCO 740 outputs a multi-phase clock having a frequency corresponding to the level of the control voltage Vctrl.

A fractional divider 750 receives the multi-phase clock of the VCO 740, selects a divider according to a digital profile of a modulation profile generator 760, and applies a divided clock as the feedback clock.

The modulation profile generator 760 outputs the digital profile obtained by quantizing a piecewise linear modulation profile consisting of two or more linear signals. The modulation profile generator 760 may include a delta-sigma modulator. For example, the modulation profile generator 760 may be synchronized with the feedback block. Meanwhile, the modulation profile generator 760 may comprise an accumulator controller and an accumulator. The accumulator controller outputs an accumulator control signal corresponding to the piecewise linear modulation profile. The accumulator outputs an M-bit digital profile obtained by adding or subtracting an appropriate value to/from a previous output according to the accumulator control signal.

The piecewise linear modulation profile may comprise maximums, minimums and sectional inclinations of the linear signals.

Figure 8:
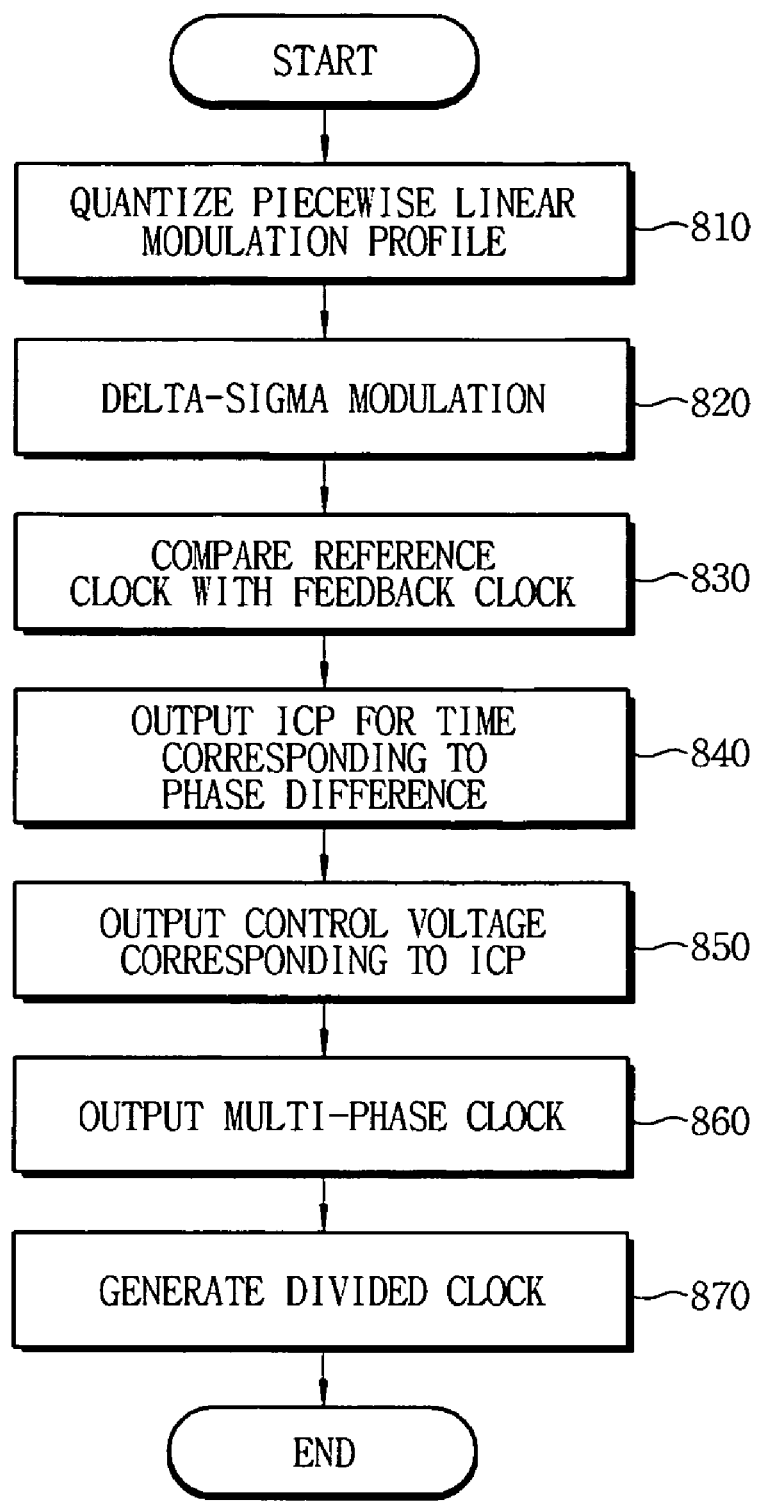
FIG. 8 is a flowchart showing a method of generating a clock using piecewise linear modulation according to still another exemplary embodiment of the present invention.

FIG. 8 is a flowchart showing a method of generating a clock using piecewise linear modulation according to still another exemplary embodiment of the present invention.

First, an M-bit digital profile obtained by quantizing a piecewise linear modulation profile consisting of two or more linear signals is output (step 810).

The M-bit digital profile is received, and a K-bit profile obtained by delta-sigma modulating the M-bit digital profile is output (step 820). Here, K is a smaller number than M.

Up and down pulses having the same phase difference as that between a reference clock and a feedback clock are output (step 830).

For a time corresponding to the phase difference between the up and down pulses, a predetermined current Icp is output (step 840).

A control voltage corresponding to the predetermined current Icp is output (step 850).

A multi-phase clock having a frequency corresponding to the level of the control voltage is output (step 860).

Finally, the multi-phase clock is received, a divider is selected according to the K-bit profile, and a divided clock is applied as the feedback clock (step 870). The feedback clock generated in step 870 is used in the process of outputting the M-bit digital profile (step 810) and the process of outputting the up and down pulses (step 830).

The entire process (steps 810 to 870) is repeated using a feedback loop.

The present invention provides a modulation method of Spread-Spectrum Clock Generator (SSCG) that uses a piecewise linear modulation scheme approximating linear signals to a non-linear modulation profile. Here, the piecewise linear modulation scheme divides the modulation profile of a non-linear signal into two or more sections and approximates linear signals to the modulation profile.

Here, a delta-sigma modulator having an output of two or more bits may be employed in the SSCG.

Here, a multi-phase clock of a VCO or a fractional divider using a phase interpolator may constitute a feedback loop of the SSCG.

Meanwhile, regardless of the number of multi-phase clocks of a VCO or the number of phases that can be generated by a phase interpolator, a fractional divider may use the multi-phase clocks or have the phase interpolator therein.

The present invention provides a modulation method for minimizing EMI. The modulation method used in an exemplary embodiment of the present invention is a piecewise linear modulation scheme, by which inclinations around the maximum and minimum points are increased to reduce EMI. Here, to obtain an appropriate frequency, a PLL feedback divider is driven by multiple phases of a VCO.

A conventional Hershey-Kiss modulation scheme minimizes EMI but is hard to implement in a circuit. On the other hand, the present invention solves the problem using the piecewise linear modulation scheme combining a plurality of linear signals. In addition, the present invention can precisely control frequency using a phase interpolator in a PLL feedback divider.

As is apparent from the above description, according to the present invention, it is possible to minimize EMI using piecewise linear modulation and readily implement an exemplary embodiment of the present invention on a chip due to a modulation profile consisting of two or more linear signals. In addition, a delicate fractional divider using a multi-phase clock of a VCO and a phase interpolator allows precise frequency interpolation. Furthermore, since a clock is prevented from being applied to an unused block, unnecessary power consumption can be reduced.

An SSCG according to an exemplary embodiment of the present invention is expected to be an important clock provider of various electronic devices, and also a base product for network-based Application-Specific Integrated Circuit (ASIC) development as the driving force of network-based electronic devices.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An apparatus for generating a clock using piecewise linear modulation, comprising:
    a modulation profile generator for outputting an M-bit digital profile obtained by quantizing a piecewise linear modulation profile including two or more linear signals;
    a delta-sigma modulator for receiving the M-bit digital profile and outputting a K-bit profile obtained by delta-sigma modulating the M-bit digital profile, K being a smaller number than M;
    a phase-frequency comparator for outputting up and down pulses having the same phase difference as that between a reference clock and a feedback clock;
    a charge pump for outputting a predetermined current for a time corresponding to the phase difference between the up and down pulses;
    a loop filter for outputting a control voltage corresponding to the predetermined current;
    a voltage controlled oscillator (VCO) for outputting a multi-phase clock having a frequency corresponding to a level of the control voltage; and
    a fractional divider for receiving the multi-phase clock of the VCO, selecting a divider according to the K-bit profile, and outputting a divided clock as the feedback clock signal, by interpolating phases of the multi-phase clock, the fractional divider including
        a division controller for outputting a selection signal according to the K-bit profile of the delta-sigma modulator and the feedback clock,
        a phase selector for selecting a clock signal from the multi-phase clock according to the selection signal, and
        a phase interpolator for interpolating the selected clock signal according to the selection signal to generate a divided clock, wherein the phase selector includes
            an edge detector for detecting an edge of the output of the division controller,
            a sampling synchronizer for synchronizing the multi-phase clock with the detected edge, and
            a multiplexer for selecting the clock signal from the multi-phase clock and dividing the frequency of the multi-phase clock.

2. The apparatus of claim 1, wherein the modulation profile generator comprises:
    an accumulator controller for outputting an accumulator control signal corresponding to the piecewise linear modulation profile; and
    an accumulator for outputting the M-bit digital profile obtained by adding or subtracting a value according to the accumulator control signal to/from a previous output.

3. The apparatus of claim 1, wherein the piecewise linear modulation profile comprises maximums, minimums and sectional inclinations of the linear signals.

4. The apparatus of claim 1, wherein the modulation profile generator has a Pseudo Random Bit Sequence (PRBS) therein.

5. The apparatus of claim 1, wherein clock gating technology is applied to the modulation profile generator.

6. A method of generating a clock using piecewise linear modulation, comprising:
    outputting, by a modulation profile generator, an M-bit digital profile obtained by quantizing a piecewise linear modulation profile including two or more linear signals;
    receiving, by a delta-sigma modulator, the M-bit digital profile and outputting a K-bit profile obtained by delta-sigma modulating the M-bit digital profile, K being a smaller number than M;
    outputting, by a phase-frequency comparator, up and down pulses having the same phase difference as that between a reference clock and a feedback clock;
    outputting, by a charge pump, a predetermined current for a time corresponding to the phase difference between the up and down pulses;
    outputting, by a loop filter, a control voltage corresponding to the predetermined current;

outputting, by a voltage controlled oscillator (VCO), a multi-phase clock having a frequency corresponding to a level of the control voltage; and receiving, by a fractional divider, the multi-phase clock, selecting a divider according to the K-bit profile, and applying a divided clock as the feedback clock by interpolating phases of the multi-phase clock, the applying further including outputting, by a division controller, a selection signal according to the K-bit profile of the delta-sigma modulator and the feedback clock, selecting, by a phase selector, a clock signal from the multi-phase clock according to the selection signal, and interpolating, by a phase interpolator, the selected clock signal according to the selection signal to generate a divided clock, wherein the selecting by the phase selector includes detecting, by an edge detector, an edge of the output of the division controller, synchronizing, by a sampling synchronizer, the multi-phase clock with the detected edge, selecting, by a multiplexer, the clock signal from the multi-phase clock, and dividing, by the multiplexer, the frequency of the multi-phase clock.

\* \* \* \* \*